United States Patent
Kolodin et al.

(10) Patent No.: US 7,737,457 B2
(45) Date of Patent: Jun. 15, 2010

(54) PHOSPHOR DOWN CONVERTING ELEMENT FOR AN LED PACKAGE AND FABRICATION METHOD

(75) Inventors: Boris Kolodin, Beachwood, OH (US); Emil Vergilov Radkov, Euclid, OH (US)

(73) Assignee: Lumination LLC, Cleveland, OH (US)

( * ) Notice: Subject to any disclaimer, the term of this patent is extended or adjusted under 35 U.S.C. 154(b) by 0 days.

(21) Appl. No.: 11/862,534

(22) Filed: Sep. 27, 2007

(65) Prior Publication Data

US 2009/0085049 A1 Apr. 2, 2009

(51) Int. Cl.
*H01L 33/00* (2010.01)
(52) U.S. Cl. .................................. 257/98; 257/E33.061
(58) Field of Classification Search .................... 257/98, 257/E33.061
See application file for complete search history.

(56) References Cited

U.S. PATENT DOCUMENTS

| | | | |
|---|---|---|---|
| 5,976,613 | A | 11/1999 | Janusauskas |
| 6,614,039 | B2 | 9/2003 | Hollander |
| 6,921,929 | B2 | 7/2005 | LeBoeuf et al. |
| 7,245,072 | B2 * | 7/2007 | Ouderkirk et al. ........... 313/502 |
| 2003/0230977 | A1 | 12/2003 | Epstein |
| 2004/0145913 | A1 * | 7/2004 | Ouderkirk et al. ........... 362/555 |
| 2005/0127378 | A1 * | 6/2005 | Suehiro et al. ................ 257/81 |
| 2005/0274967 | A1 | 12/2005 | Martin |
| 2007/0001182 | A1 * | 1/2007 | Schardt et al. ................ 257/98 |

OTHER PUBLICATIONS http://www.welchfluorocarbon.com/techdata.htm (Aug. 6, 2007), Welch Fluorocarbon Inc., Thin Fluoropolymer Film Experts: PTFE, FEP, PFA, Copyright 1985-2007 (updated Apr. 4, 2007 by KJW), pp. 1-8.

* cited by examiner

*Primary Examiner*—Victor A Mandala
(74) *Attorney, Agent, or Firm*—Fay Sharpe LLP

(57) ABSTRACT

There is provided a phosphor down converting element based on fluoropolymer resin and a method for fabricating the same. There is further provided a method for using said phosphor down converting element to generate white light from a radiation source. The method for fabricating phosphor down converting element includes preparing an appropriate phosphor powder mixture that is capable of absorbing a first band of wavelengths and emitting a second band of wavelengths being greater in length than the first bands, incorporating the phosphor powder mixture into or on a phosphor carrier element comprising a fluoropolymer material, and molding the phosphor down converting elements into useful shapes. Fluoropolymers are the most chemically inert of all plastics, can withstand both extremely high and low temperatures, and show a resistance to weavering and UV degradation, making fluoropolymers optimal for use as a phosphor carrier.

8 Claims, 2 Drawing Sheets

PHOSPHOR DOWN CONVERTING ELEMENT FOR AN LED PACKAGE AND FABRICATION METHOD

BACKGROUND

The present embodiments relate to a down converting element based on organic fluoropolymer material. It finds particular application in conjunction with solid state light emitting devices, and will be described with particular reference thereto. However, it is to be appreciated that the present exemplary embodiment is also amenable to other like applications.

Light emitting diodes (LEDs) are well known solid-state, or semi-conductor devices that can generate light having a peak wavelength in a specific region of the visible spectrum. More recently developed LEDs emit blue to ultraviolet (UV) light.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Continuous performance improvements have enabled new applications for LEDs of saturated colors in traffic lights, exit signs, store signs, and the like.

In addition to colored LEDs, a combination of LED generated light and phosphor generated light may be used to produce white light. The most popular white LEDs include blue emitting GaInN chips. The blue emitting chips are coated with a phosphor that converts some of the blue radiation to a complementary color, e.g. a yellowish emission. Together, the blue and yellowish radiation produces a white light. There are also white LEDs that utilize a near UV emitting chip and a phosphor blend including red, green and blue-emitting phosphors designed to convert the UV radiation to visible light.

For mechanical integrity, phosphor powders are typically integrated into or coated onto a transparent substrate. Desirably, such substrates should have greater than 90% transparency for the 254-750 spectral region and long term stability (mechanical, thermal and photochemical) under exposure of UV radiation at elevated temperatures. Very few materials satisfy the above requirements to be suitable substrates for the phosphor powder. Therefore, identification of practical, non-fragile, UV and thermal resistant materials for the phosphor carrier in solid state lighting (SSL) applications and phosphor down converting improvement is necessary.

A well-known PMMA plastic (acrylic) has very low upper service temperature ~90 C and cannot practically be employed for outdoor applications. Some silicones may be considered as suitable materials; however they do not possess sufficient mechanical rigidity. Various types of glasses fit the requirements and are used as phosphor carriers for design and manufacture light sources in lighting industry and can also be incorporated into solid state lighting devices, but glass is often too fragile for most applications. For example, U.S. Patent Application (Pub. No. US 2005/0274967 A1) proposed utilizing inorganic materials like glass as a phosphor down converting material carrier; however glass fragility is an essential disadvantage to this approach.

Therefore, it would be desirable to develop a down converting element that can be effectively used in phosphor down converting applications that is practical, non-fragile and resistant to ultraviolet degradation.

BRIEF DESCRIPTION

In one aspect, there is provided a phosphor down converting element. The element includes a phosphor carrier including an organic fluoropolymer material, a phosphor material capable of absorbing radiation having a first peak wavelength and emitting radiation having a second peak wavelength longer than said first peak wavelength, located in or on said phosphor carrier.

In a second aspect there is provided a method for fabricating phosphor down converting element having a phosphor material incorporated into or on a carrier. The method includes preparing an appropriate phosphor material that is capable of absorbing a first radiation having a first peak wavelength and emitting a second radiation having a second peak wavelength longer than said first peak wavelength, incorporating the phosphor material into or on a carrier element comprising a fluoropolymer material, and molding the phosphor down converting element into a desired shape.

In a third aspect there is provided a light emitting device. The device includes a semiconductor light emitter capable of emitting radiation having a first peak wavelength, a phosphor carrier including an organic fluoropolymer material, a phosphor material capable of absorbing radiation having said first peak wavelength and emitting radiation having a second peak wavelength longer than said first peak wavelength, located in or on said phosphor carrier.

DETAILED DESCRIPTION

Figure 1:
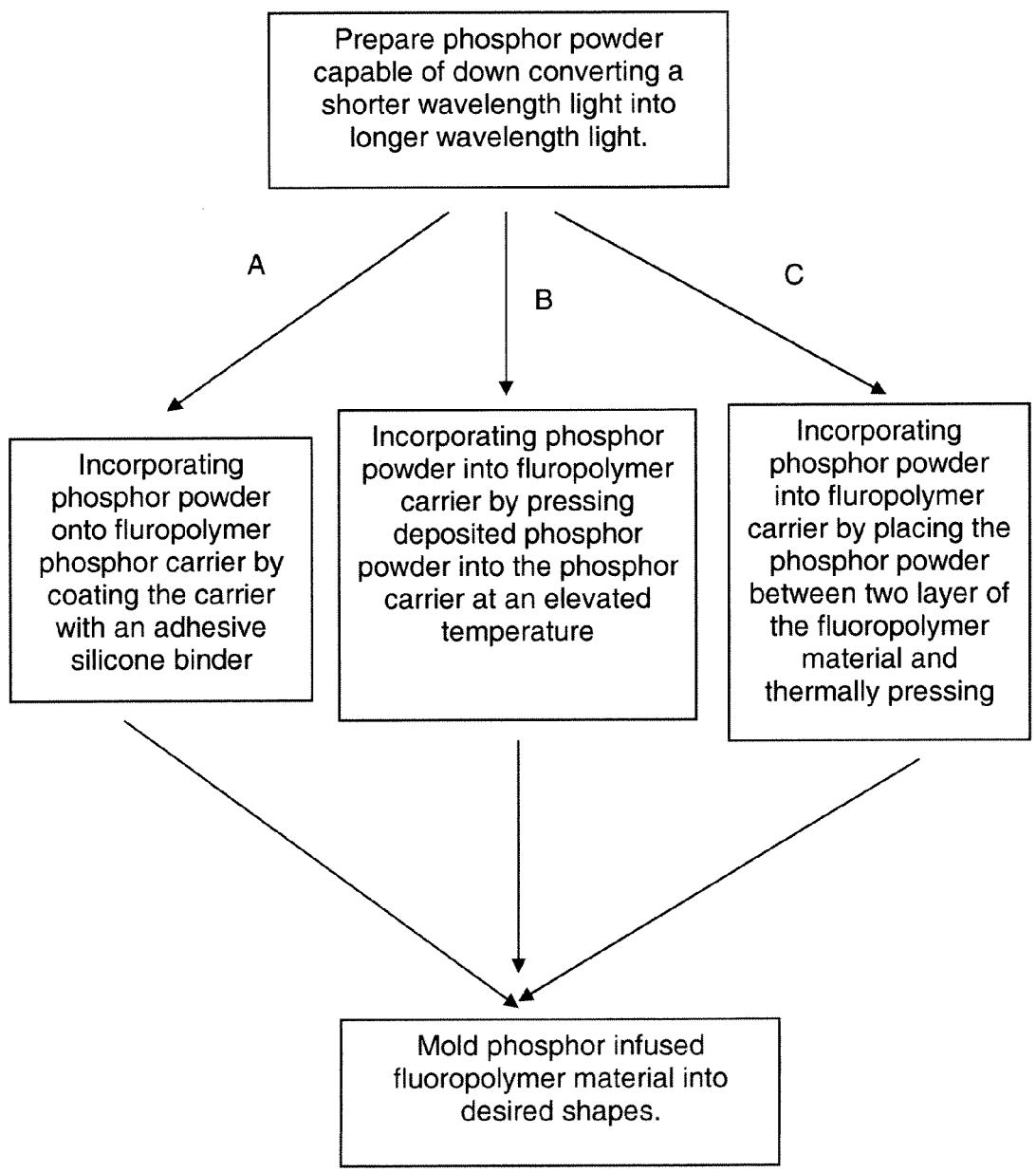
FIG. 1 represents a method of fabricating a down converting element for an light emitting device according to one embodiment of the present invention.

In view of the problems in the prior art, it is desirable to obtain a phosphor down converting element with a practical, non fragile, and UV and thermal resistant phosphor carrier. The present embodiments provide such a phosphor down converting element with a fluoropolymer carrier and a method for fabricating the same. The carrier may take the form of a shell, lens, or other type of encapsulant. In one embodiment, the carrier is a shell that surrounds an LED chip.

In one preferred embodiment, a phosphor material is mixed with a fluoropolymer material to produce a phosphor down converting element. The down converting element is used with a semiconductor light emitter such as an LED in a light emitting device to convert at least some of the radiation emitted by the light emitter to a longer wavelength visible light.

The color of the generated visible light is dependent on the particular components of the phosphor material. The phosphor material may include only a single phosphor composition or two or more phosphors of basic color, for example a particular mix with one or more of a yellow and red phosphor to emit a desired color (tint) of light. As used herein, the terms "phosphor" and "phosphor material" may be used to denote both a single phosphor composition as well as a blend of two or more phosphor compositions.

The light emitting device may include any semiconductor visible or UV light source, such as an LED, that is capable of producing radiation for exciting the phosphor material. The preferred peak emission of the LED will depend on the identity of the phosphors in the disclosed embodiments and the end use of the device, but may range from, e.g., 250-550 nm. In one preferred embodiment, however, the emission of the LED will be in the near UV to deep blue region and have a peak wavelength in the range from about 350 to about 430 nm. Typically then, the semiconductor light source comprises an LED doped with various impurities. Thus, the LED may comprise a semiconductor diode based on any suitable III-V, II-VI or IV-IV semiconductor layers and having an emission wavelength of about 250 to 550 nm.

Preferably, the LED may contain at least one semiconductor layer comprising GaN, ZnO or SiC. For example, the LED may comprise a nitride compound semiconductor represented by the formula $In_iGa_jAl_kN$ (where $0 \leq i$; $0 \leq j$; $0 \leq k$ and $i+j+k=1$) having a peak emission wavelength greater than about 250 nm and less than about 550 nm. Such LED semiconductors are known in the art. The radiation source is described herein as an LED for convenience. However, as used herein, the term is meant to encompass all semiconductor radiation sources including, e.g., semiconductor laser diodes.

In addition, although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

FIG. 1 illustrates a first preferred method for fabricating a phosphor down converting element according to a first embodiment. First, a phosphor powder material is prepared using known processes.

The above described phosphor composition may be produced using known solution or solid state reaction processes for the production of phosphors by combining, for example, elemental nitrides, oxides, carbonates and/or hydroxides as starting materials. Other starting materials may include nitrates, sulfates, acetates, citrates, or oxalates. Alternately, coprecipitates of the rare earth oxides could be used as the starting materials for the RE elements. In a typical process, the starting materials are combined via a dry or wet blending process and fired in air or under a reducing atmosphere or in ammonia at from, e.g., 1000 to 1600° C. The crude phosphor may be then milled to a desired particle size, washed and dried prior to use. The resulting phosphor particles may preferably have median diameters ($d_{50}$) ranging from 0.5-30 μm, as determined by light scattering analysis or microscopy measurements.

As noted above, the phosphor material may consist of a combination of two or more phosphors that each emit radiation in a specific wavelength range corresponding to the same or different colored light. Such blends are known in the art, for instance phosphors emitting red, green, and blue light, and phosphors emitting yellow and blue light are conventionally used to produce white light. Each phosphor in the phosphor material should be chosen to have an absorption band matched with the wavelength of the radiation emitted by the light source, and preferably also compatible absorption coefficients to provide high performance.

Phosphors meeting these requirements are known in the art, and have been described extensively elsewhere. Suitable phosphors for use in the present embodiments include, but are not limited to, nitrides, oxynitrides, aluminates, silicates or halophosphates of alkaline earth metals doped with at least one of divalent europium or trivalent cerium.

The prepared phosphor material is then incorporated into a fluoropolymer phosphor carrier in any appropriate method. The phosphor material may be coated on a surface of the carrier, diffused throughout the carrier, etc. FIG. 1 illustrates three exemplary methods for incorporating the phosphor material into the carrier. In one preferred method A, the carrier is coated with an adhesive silicone binder or other binder to secure the phosphor material. The phosphor material is then spray coated or otherwise applied to a surface of the carrier. In a second preferred method B, the phosphor material powder is incorporated into the fluoropolymer carrier by pressing the powder onto the carrier at an elevated temperature. In a third preferred method C, the phosphor powder is incorporated into the fluoropolymer phosphor material by placing the powder in between two or more layers of the carrier and thermally pressing the layers together to form a laminated carrier. The phosphor incorporated carrier may then be molded into useful shapes, preferably using a vacuum thermal forming or transfer molding technique. Other methods may alternatively be used, such as, for example, activating a surface of the fluoropolymer carrier and then applying the phosphor material to said activated surface.

The carrier material is preferably an organic fluoropolymer material. Fluoropolymers are the preferred material for the encapsulating phosphor carrier of the present invention due to its optical transparency (greater than 90% for the 254-750 nm spectral regions) and its long term (50,000-100,000 hours) stability under exposure to UV radiation at elevated temperatures. Fluoropolymers are the most chemically inert of all plastics, withstand high and low temperature extremes, can be made free of plasticizes or additives, and have excellent processability with conventional thermoplastic methods. Preferred fluoropolymers are fluoropolymer resins, non-limiting examples of which are FEP (fluorinated ethylene-propylene polymer) and PFA (perfluoroalkoxy polymer), which have optical quality transmission characteristics over the range from 190 nm-750 nm and are particularly preferred for use in the present invention. Further, FEP has a coefficient of absorption of 36 cm$^{-1}$. Total carrier thickness is preferably limited to less than 100 micrometers, thereby preventing unacceptable optical losses. Fluoropolymer material is also more practical than acrylic or glass, because of its ability to withstand high temperatures and its reduced fragility.

Figure 2:
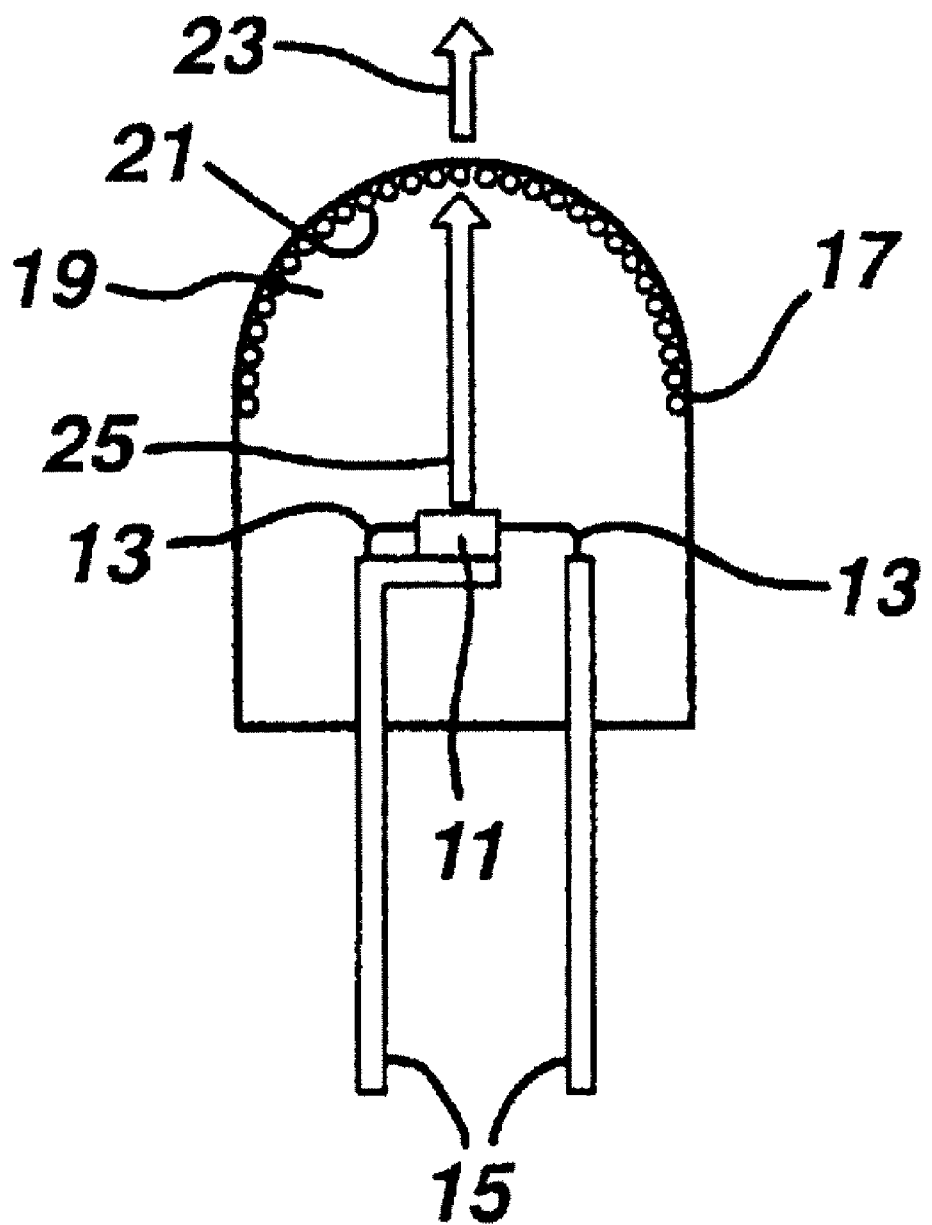
FIG. 2 is a cross-sectional schematic representation of a white light illumination system according to a the preferred embodiment of the present invention.

One example of a preferred embodiment device incorporating the phosphor converting element is illustrated in FIG. 2.

The device includes a LED chip 11 supported by lead frame 15. LED chip 11 may be directly electrically connected to either the anode or cathode of lead frame 15 and connected by lead 13 to the opposite anode or cathode lead frame 15 as displayed in FIG. 2. The leads 13 may comprise thin wires supported by a thicker lead frame(s) 15 or the leads may comprise self supported electrodes and the lead frame 15 may be omitted. The leads provide current to the LED chip 11 and thus cause it to emit radiation. In another embodiment of the present invention LED chip 11 may directly connect to both the anode and cathode of the lead frame 15 simultaneously, removing the need for lead 13. Alternatively, LED chip 12 may not directly connect with either the anode or cathode of lead frame 16, and instead connect to each electrode through lead 13. Lead frame 15 connects to a power supply, such as a current or voltage source or to another circuit (not shown).

A shell or carrier 17 made from the fluropolymer is positioned around the LED chip. The phosphor material 21 is positioned on, in or adjacent a fluoropolymer shell or carrier 17, as detailed above. In this figure, the phosphor material is positioned on an inside surface of the shell. An encapsulant, such as silicone or epoxy, or an air pocket 19 is positioned between the shell 17 and the LED chip 11. Light emitted by the LED chip 25 excites the phosphor material, and the combined emission from the phosphor and any residual LED bleed is emitted from the device at 23.

The phosphor material may be dispersed within the fluoropolymer material, adhesively bound to its surface, coated on its surface, or pressed into the material at an elevated temperature. As used herein, the term "associated" may be used to designate one or more of these conditions. The layer of phosphor down converting element may coat the entire surface of the shell 17 or only the portion directly above the LED chip 11.

The exemplary embodiments have been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

What is claimed is:

1. A lighting device comprising a solid state light emitter, a fluoropolmer phosphor carrier and a phosphor material capable of absorbing radiation having a first peak wavelength and emitting radiation having a second peak wavelength longer than said first peak wavelength, said carrier having a curved shape to receive light emitted by said emitter, said phosphor being disposed on or in said carrier.

2. The device of claim 1, wherein said fluoropolymer carrier is a fluoropolymer resin.

3. The device of claim 2, wherein said fluoropolymer resin is selected from the group consisting of FEP and PFA.

4. The device of claim 1, wherein said solid state light emitter comprises an LED.

5. The device of claim 1, wherein said phosphor material comprises a white light emitting phosphor blend.

6. The device of claim 1, wherein said phosphor material comprises at least one of nitride, oxynitride, aluminate, silicate or halophosphate of alkaline earth metals doped with at least one of divalent europium or trivalent cerium.

7. A light emitting device including a semiconductor light emitter capable of emitting radiation having a first peak wavelength, a carrier comprised of a fluoropolymer material, and a phosphor material capable of absorbing radiation having said first peak wavelength and emitting radiation having a second peak wavelength longer than said first peak wavelength, said phosphor disposed on or in said carrier, said carrier encapsulating said light emitter.

8. The light emitting device of claim 7, wherein said phosphor material comprises at least one of nitride, oxynitride, aluminate, silicate or halophosphate of alkaline earth metals doped with at least one of divalent europium or trivalent cerium.

* * * * *